(12) United States Patent
Cheng

(10) Patent No.: US 6,353,999 B1
(45) Date of Patent: Mar. 12, 2002

(54) METHOD OF MAKING MECHANICAL-LASER STRUCTURE

(75) Inventor: David C. H. Cheng, Taoyuan Hsien (TW)

(73) Assignee: Unimicron Taiwan Corp., Taipei (TW)

( * ) Notice: Subject to any disclaimer, the term of this patent is extended or adjusted under 35 U.S.C. 154(b) by 0 days.

(21) Appl. No.: 09/306,340

(22) Filed: May 6, 1999

(30) Foreign Application Priority Data

Mar. 9, 1999 (TW) .......................................... 88103571

(51) Int. Cl.$^7$ ................................................ H01K 3/10

(52) U.S. Cl. ........................... 29/852; 29/846; 174/261; 174/266; 427/97

(58) Field of Search .......................... 29/852, 830, 825, 29/846; 427/97; 174/261, 266

(56) References Cited

U.S. PATENT DOCUMENTS

| | | | | |
|---|---|---|---|---|
| 5,129,142 A | * | 7/1992 | Bindra et al. .................. | 29/852 |
| 5,257,452 A | * | 11/1993 | Imai et al. ..................... | 29/852 |
| 5,421,083 A | * | 6/1995 | Suppelsa et al. ............... | 29/852 |
| 5,502,893 A | * | 4/1996 | Endoh et al. ................... | 29/852 |
| 5,949,030 A | * | 9/1999 | Fasano et al. ................. | 29/852 |

* cited by examiner

*Primary Examiner*—Carl J. Arbes
(74) *Attorney, Agent, or Firm*—J.C. Patents

(57) ABSTRACT

A mechanical-laser structure on a printed circuit board and a carrier. A method for fabricating the mechanical-laser structure includes the following steps. A substrate is provided. A first through hole is formed in the substrate by mechanical drilling. An epoxy plug is formed within the first through hole. A conductive layer is formed on the substrate by compression. The conductive layer is patterned to form conducting wires and exposes the epoxy plug. A micro via is formed within the epoxy plug by laser drilling.

8 Claims, 3 Drawing Sheets

METHOD OF MAKING MECHANICAL-LASER STRUCTURE

CROSS-REFERENCE TO RELATED APPLICATION

This application claims the priority benefit of Taiwan application Ser. No. 88103571, filed Mar. 9, 1999, the full disclosure of which is incorporated herein by reference.

BACKGROUND OF THE INVENTION

1. Field of the Invention

The present invention relates to a printed circuit board. More particularly, the present invention relates to a mechanical-laser structure on a printed circuit board and a carrier.

2. Description of the Related Art

A trend for electrical products is to be light, short, small and thin. Not only the design of a circuit on a substrate but also the manufacturing technology of the substrate should be improved to meet these trends. A linewidth of the circuit is more narrowly formed to increase the layout density. Additionally, a diameter of a through hole is also narrower to speed up the operation of the circuit.

The through hole is mostly formed by mechanical drilling in the current. The narrowest diameter of the through hole formed by mechanical drilling is 0.2 mm. This the limitation of the machine, so is hard to reduce the diameter of the through hole more. The area occupied by the through hole is large. Furthermore, it is also more difficult to reduce the routing density, so RC delay is large. Laser drilling is another method of forming the through hole, and the diameter of the through hole formed by laser drilling is narrower than 0.2 mm, which means that laser drilling overcomes drawbacks of mechanical drilling. However, the substrate usually contains glass fiber layers which decrease the efficiency of laser drilling. As a result, the manufacturing cost and the manufacturing time are increased.

SUMMARY OF THE INVENTION

Accordingly, the present invention provides a mechanical-laser structure on a printed circuit board and a carrier in which the routing density and RC delay are reduced.

To achieve these and other advantages and in accordance with the purpose of the invention, as embodied and broadly described herein, the invention provides a method for fabricating a mechanical-laser structure on a printed circuit board and a carrier. The method includes the following steps. A substrate is provided. A first through hole is formed in the substrate by mechanical drilling. An epoxy plug is formed within the first through hole. A conductive layer is formed on the substrate by compression. The conductive layer is patterned to form conducting wires and exposes the epoxy plug. A micro via is formed within the epoxy plug by laser drilling.

To achieve these and other advantages and in accordance with the purpose of the invention, as embodied and broadly described herein, the invention provides a mechanical-laser structure. A substrate having a first through hole is provided. A plug is formed within the first through hole. A second through hole is formed in the plug.

To achieve these and other advantages and in accordance with the purpose of the invention, as embodied and broadly described herein, the invention provides another mechanical-laser structure, A central layer having a first through hole is provided. A first conducting wire is formed on the central layer, and the first through hole is exposed. A first conductive layer is formed on a sidewall of the first through hole and coupled with the first conducting wire. An insulation layer is formed on the first conducting wire and fills the first through hole to form a plug. A second through hole is formed in the plug. A second conducting wire is formed on the insulation layer, and the second through hole is exposed. A second conductive layer is formed on a sidewall of the second through hole and coupled with the second conducting wire.

By using epoxy, the efficiency of laser drilling is improved. As a result, the manufacturing time and the manufacturing cost are decreased. Since the micro via is formed by laser drilling, the diameter of the micro via is narrower. The layout density is increased. Furthermore, the routing density and RC delay are reduced.

It is to be understood that both the foregoing general description and the following detailed description are exemplary, and are intended to provide further explanation of the invention a s claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
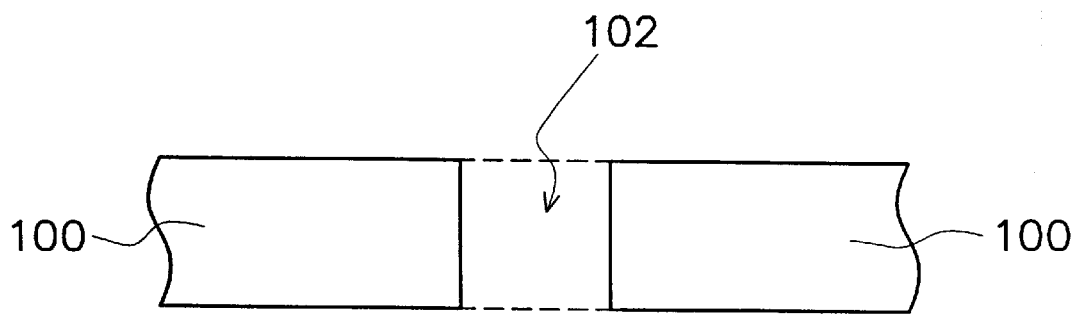
FIGS. 1 through 5 are schematic, cross-sectional diagrams of mechanical-laser structure fabrication according to the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 through 5 are schematic, cross-sectional diagrams of mechanical-laser structure fabrication according to the invention.

Referring to FIG. 1, a substrate 100 is provided and both sides of the substrate 100 are covered by dielectric layers (not shown). A mechanical drilling process is performed to form a through hole 102 in the substrate 100. The substrate 100 is formed by a prepreg such as FR-4 or BT (Bismaleimide-Triazine) resin. A diameter of the through hole 102 is about 0.2 mm.

Figure 2:
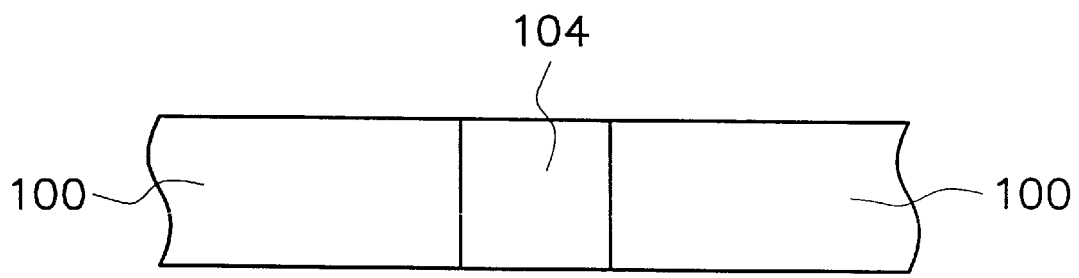

Referring to FIG. 2, an insulation material (not shown) is applied on both sides of the substrate 100, and then a printing process is performed. As a result, a plug 104 is formed within the through hole 102 (FIG. 1). The insulation material is preferably epoxy. Additionally, before the plug 104 is filled into the through hole 102 (FIG. 1), a conductive layer (not shown) can be formed on a sidewall of the through hole 102 to serve as an electrical coupling between circuits (not shown) stacked in the substrate 100. The step of forming the conductive layer includes, for example, electroplating.

Figure 3:
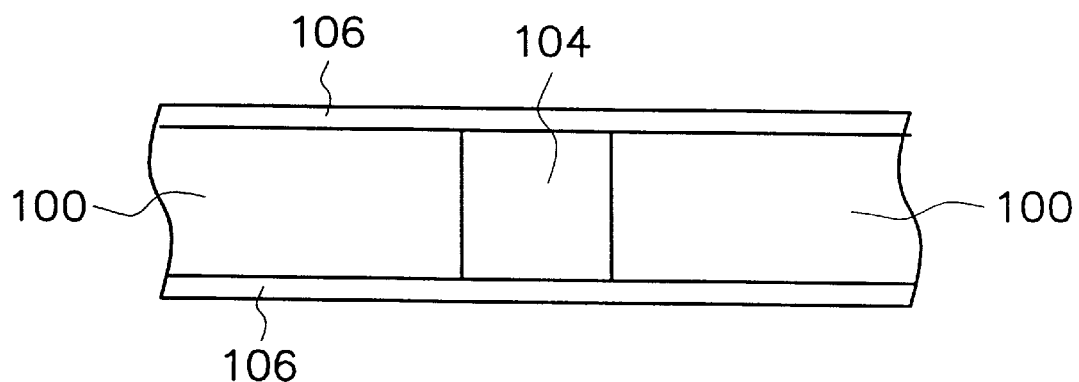

Referring to FIG. 3, conductive layers 106 are formed on both sides of the substrate 100 by, for example, compression, in which the plug 104 is covered on its both sides also. The conductive layers 106 include copper or other conducting materials and are electrically coupled to each other through the conductive layer.

Figure 4:
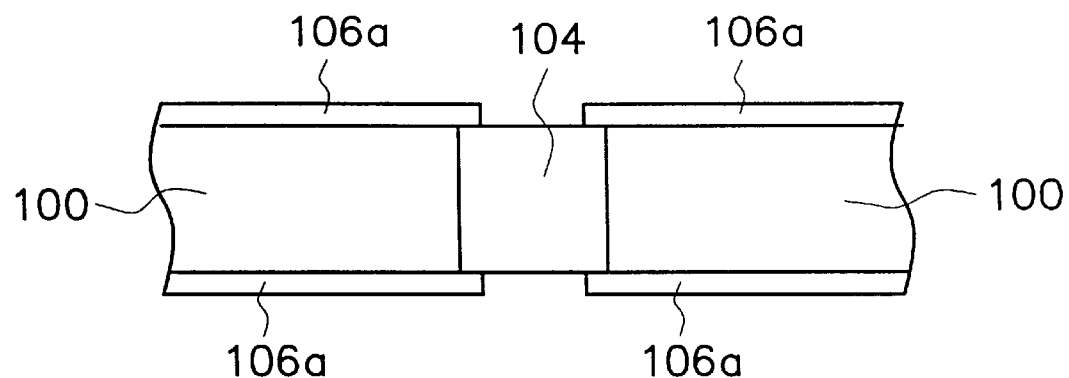

Referring to FIG. 4, the conductive layers 106 are patterned to form conducting wires 106a, and a portion of the plug 104 on both sides is exposed.

Figure 5:
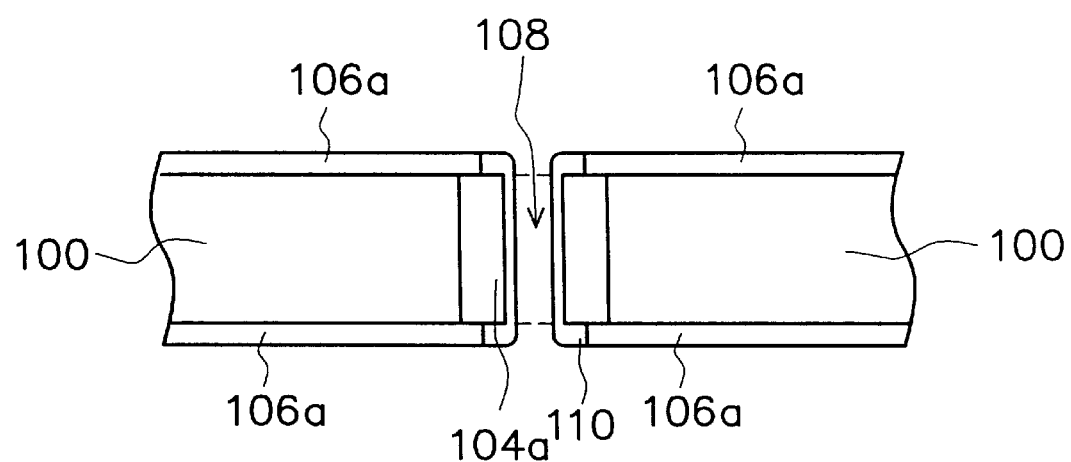

Referring to FIG. 5, a laser drilling process is performed to form a micro via hole 108 in the plug 104 (FIG. 4), so that the plug 104 becomes a plug 104a with the micro via hole 108. A diameter of the micro via hole 108 is about 0.1 mm. Furthermore, a conductive layer 110 on a sidewall of the micro via hole 108 or a metal plug (not shown) within the micro via hole 108 is formed to couple with the conducting wires 106a after forming the micro via hole 108. The step of forming the conductive layer on the sidewall of the micro via hole 108 includes electroplating.

The laser used for forming the micro via hole 108 includes a carbon dioxide laser or an Yttrium-Aluminum-Garnet (YAG) laser. A wavelength of the carbon dioxide laser is about 10.6 $\mu$m, and a beam size is about 0.1 mm. A wavelength of the Yttrium-Aluminum-Garnet laser is about 1.064 $\mu$m, and a beam size is about 0.05 mm.

The number of pulses of the laser used is about 8 to 10 to form the micro via hole, whose diameter is, for example, about 0.2 mm and depth is, for example, about 0.2 mm in epoxy. The number of pulses of the laser is about 26 to 30 to form the same micro via hole in glass fiber.

The invention is also suitable for forming a mechanical-laser structure on a double-sided substrate. Furthermore, the invention can be used to form a multi-layer printed circuit board with a laminate structure.

Figure 6:
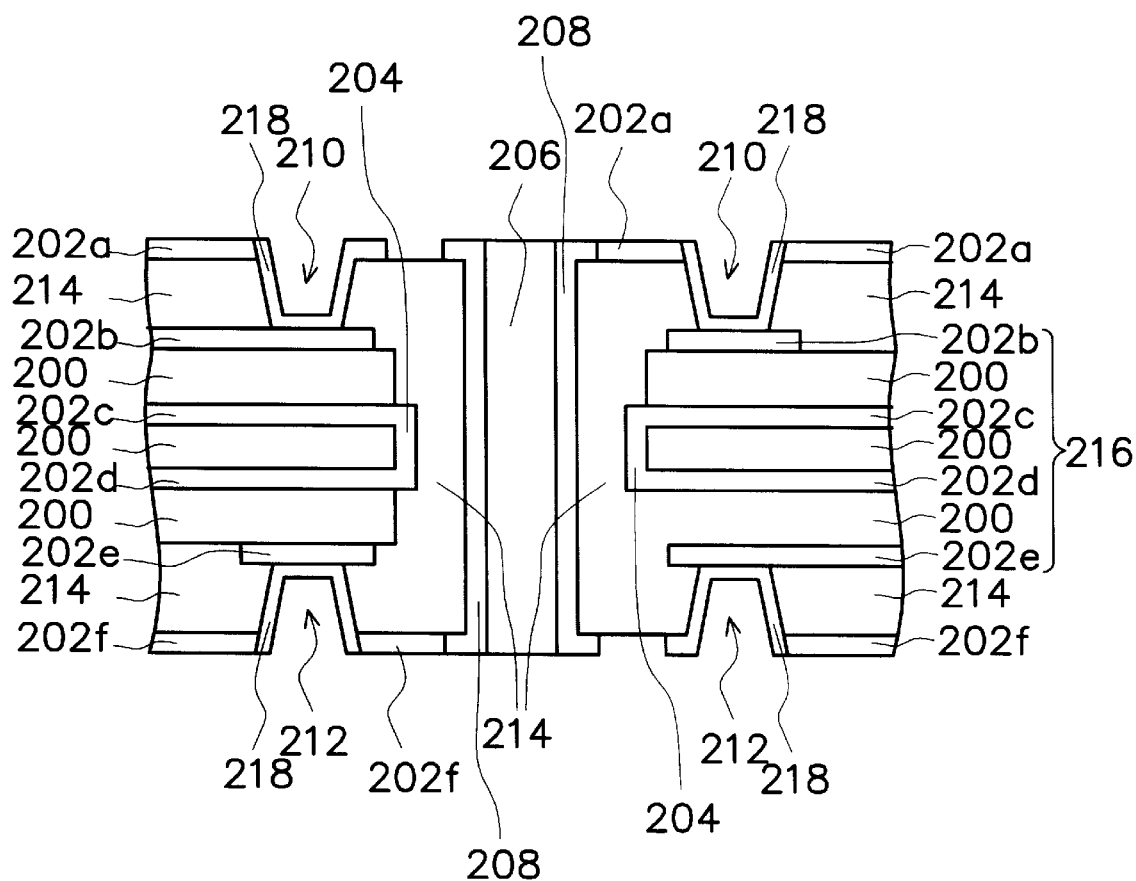
FIG. 6 is a schematic, cross-sectional diagram of a multi-layer printed circuit board having a mechanical-laser structure according to invention.

FIG. 6 is a schematic, cross-sectional diagram of a multi-layer printed circuit board having a mechanical-laser structure according to invention.

Referring to FIG. 6, a multi-layer printed circuit board 216 is formed by alternately stacking a plurality of patterned conductive layers 202b, 202c, 202d, 202e and a plurality of insulation layers 200. The conductive layers 202b and 202e are surfaces of the multi-layer printed circuit board 216. The conductive layers 202b, 202c, 202d, 202e include copper or other conducting materials, and the insulation layers 200 include FR-4 or BT resin. Additionally, dielectric layers (not shown) are formed on the conductive layers 202b and 202e, just like the substrate 100 described above. through hole (not shown) is formed in the Multi-layer printed circuit board 216 by a mechanical drilling process. A conductive layer 204 is formed on a sidewall of the through hole, so that the conductive layers 202c, 202d are coupled with each other by the conductive layer 204. The conductive layer 204 includes copper or other conducting materials , and the step of forming the conductive layer 204 includes electroplating.

Insulation layers 214 such as epoxy are formed over both sides of the multi-layer printed circuit board 216 and the through hole is also filled. Conductive layers (not shown) are formed on the insulation layers 214 by, for example, compression, and then the conductive layers are patterned to form conducting wires 202a and 202f. The conductive wires 202a and 202f include copper or other conducting materials. Openings 210 and 212 may be formed in the insulation layers 214 depending on an actual need, and conductive layers 218 are formed in the openings 210 and 212. As a result, the conductive wires 202a and 202f are electrically coupled with the conductive layers 202b and 202e, respectively. In a subsequent process, the openings 210 and 212 can be further filled with an insulation material (not shown).

A micro via, which is to be filled with insulating material to form a plug 206, is formed in the insulation layer 214 within the through hole in the multi-layer printed circuit board 216 by a laser drilling process. A diameter of the micro via is narrower than the through hole. A conductive layer 208 is formed on a sidewall of the micro via by, for example, electroplating, so that the conducting wires 202a are coupled with the conducting wires 202f by the conductive layer 208. However, the conducting wires 202a can also be coupled with the conducting wires 202f by forming a metal plug with the micro via. In the embodiment, the conductive layer 208 is used. The conductive layer 208 includes copper or other conducting materials. The plug 206 then is formed within the micro via in the subsequent process.

In the invention, a printed circuit board having a through hole is described. However, the invention is not restricted by the above descriptions. The invention is also suitable for forming a printed circuit board having a blind hole or a printed circuit board having a buried hole.

In the embodiments above, a mechanical drilling process is first performed to form a through hole. The mechanical drilling process needs only a short manufacturing time with low manufacturing cost. Epoxy is used to form a plug in the through hole with an advantage that a laser can more easily remove epoxy than glass fiber. A laser drilling process is performed to form a micro via in the plug. By using epoxy to form the plug, the efficiency of laser drilling is improved, so that the manufacturing cost and the manufacturing time are reduced. Additionally, the micro via formed by laser drilling is narrower, so that the area occupied is reduced.

The conductive layers can be formed on the sidewall of the through hole and the micro via, so that the circuits in different layers or the conducting wires on different sides of the substrate are coupled. By the formation, the layout density is increased, and the routing density is reduced. Furthermore, RC delay is reduced.

The invention can be used in many applications such as high density interconnection printed circuit board (HDIPCB), chip scale package (CSP), ball grid array substrate (BGA), flip chip and so on.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a mechanical-laser structure on a printed circuit board and a carrier, the method comprising:

providing a substrate;

forming a first through hole in the substrate by mechanical drilling;

filling epoxy resin within the first through hole to form a plug;

forming a first conductive layer on the substrate and the plug;

patterning the first conductive layer to form conducting wires, wherein the plug is exposed; and forming a second through hole within the plug by laser ablating, wherein a diameter of the second through hole is smaller than the first through hole.

2. The method of claim 1, wherein the method further comprises forming a second conductive layer on a sidewall of the first through hole before forming the plug within the first through hole.

3. The method of claim 2, wherein the step of forming the second conductive layer includes electroplating.

4. The method of claim 1, wherein a conductive material fills the second through hole after forming the second through hole.

5. The method of claim 1, wherein a third conductive layer is formed on a sidewall of the second through hole after forming the second through hole.

6. The method of claim 5, wherein the step of forming the third conductive layer includes electroplating.

7. The method of claim 1, wherein the laser used for forming the second through hole includes carbon dioxide laser.

8. The method of claim 1, wherein the laser used for forming the second through hole includes Yttrium-Aluminum-Garnet laser.

* * * * *